(12) United States Patent
Niazmand

(10) Patent No.: US 9,974,204 B2
(45) Date of Patent: May 15, 2018

(54) CABLE MANAGEMENT SYSTEM

(71) Applicant: Facebook, Inc., Menlo Park, CA (US)

(72) Inventor: Mohammad Reza Niazmand, Santa Clara, CA (US)

(73) Assignee: Facebook, Inc., Menlo Park, CA (US)

( * ) Notice: Subject to any disclaimer, the term of this patent is extended or adjusted under 35 U.S.C. 154(b) by 0 days. days.

(21) Appl. No.: 15/150,783

(22) Filed: May 10, 2016

(65) Prior Publication Data

US 2017/0332508 A1 Nov. 16, 2017

(51) Int. Cl.
*H02B 1/20* (2006.01)
*H05K 7/14* (2006.01)
*H01F 17/06* (2006.01)

(52) U.S. Cl.
CPC .......... *H05K 7/1491* (2013.01); *H01F 17/06* (2013.01)

(58) Field of Classification Search
CPC .............................. H05K 7/1491; H01F 17/06
USPC ................................................ 361/825–826
See application file for complete search history.

(56) References Cited

U.S. PATENT DOCUMENTS

| | | | |
|---|---|---|---|
| 8,243,470 B2* | 8/2012 | Jaze | H05K 9/0018 174/32 |
| 9,257,218 B2* | 2/2016 | Gibbs | H01F 7/0252 |
| 9,699,936 B1* | 7/2017 | Vargas | H05K 7/183 |
| 2004/0008499 A1* | 1/2004 | Chiang | H01F 27/266 361/797 |
| 2007/0190815 A1* | 8/2007 | Sampson | H04Q 1/06 439/49 |
| 2008/0156931 A1* | 7/2008 | Charon | H02G 3/0418 244/110 C |
| 2010/0159741 A1* | 6/2010 | Rothbaum | F16G 11/00 439/501 |
| 2015/0187460 A1* | 7/2015 | DeLoache | H02G 3/305 248/68.1 |

\* cited by examiner

*Primary Examiner* — Hung S Bui
(74) *Attorney, Agent, or Firm* — FisherBroyles, LLP

(57) ABSTRACT

A cable management system including a cable management panel comprising sheet metal having a plurality of parallel concave grooves and a pair of mounting flanges configured for mounting the panel to a rack. A plurality of magnetic cable rings are each magnetically attached to a corresponding one of the plurality of parallel concave grooves. Each cable ring includes a pair of ring halves magnetically attached to each other. At least one of the pair of ring halves comprises a magnetized material whereby one or more cables can be positioned between the pair of ring halves and secured to the cable management panel.

12 Claims, 5 Drawing Sheets

CABLE MANAGEMENT SYSTEM

TECHNICAL FIELD

This patent application is directed to cable management.

BACKGROUND

Conventional server racks include a rack that houses a number of components, such as servers and switches. Typically, multiple servers are connected to a switch with multiple cables per server. Given the sheer number of cables in a single rack, the cables can become difficult to manage with respect to cable replacement and/or rerouting.

BRIEF DESCRIPTION OF THE DRAWINGS

The cable management system introduced here may be better understood by referring to the following Detailed Description in conjunction with the accompanying drawings in which like reference numerals indicate identical or functionally similar elements.

Figure 1:
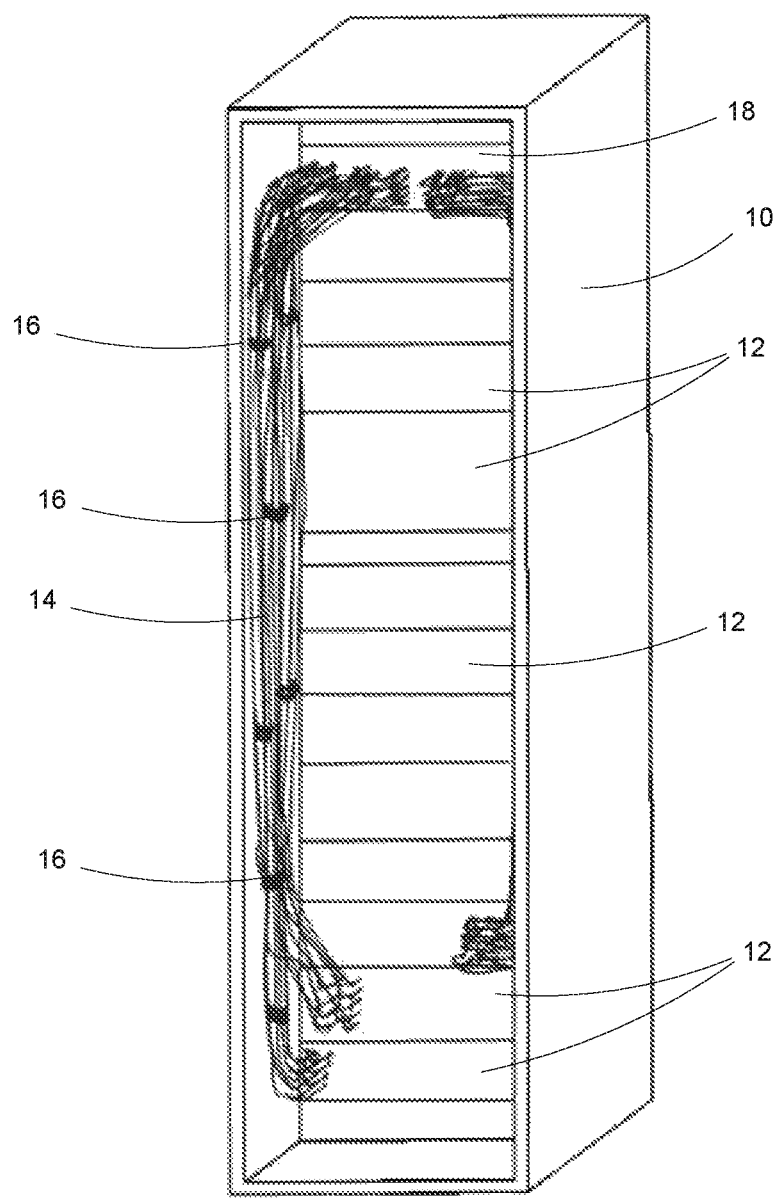
FIG. 1 is an isometric view of a conventional server rack.

The headings provided herein are for convenience only and do not necessarily affect the scope of the embodiments. Further, the drawings have not necessarily been drawn to scale. For example, the dimensions of some of the elements in the figures may be expanded or reduced to help improve the understanding of the embodiments. Moreover, while the disclosed technology is amenable to various modifications and alternative forms, specific embodiments have been shown by way of example in the drawings and are described in detail below. The intention, however, is not to limit the embodiments described. On the contrary, the embodiments are intended to cover all modifications, equivalents, and alternatives falling within the scope of the embodiments as defined by the appended claims.

DETAILED DESCRIPTION

Overview

A cable management system is disclosed. In a representative embodiment, the cable management system includes a cable management panel comprising sheet metal having a plurality of parallel concave grooves and a pair of mounting flanges configured for mounting the panel to a rack. A plurality of magnetic cable rings are each magnetically attached to a corresponding one of the plurality of parallel concave grooves. Each cable ring includes a pair of ring halves magnetically attached to each other. At least one of the pair of ring halves comprises a magnetized material whereby one or more cables can be positioned between the pair of ring halves and secured to the cable management panel.

General Description

Various examples of the devices introduced above will now be described in further detail. The following description provides specific details for a thorough understanding and enabling description of these examples. One skilled in the relevant art will understand, however, that the techniques and technology discussed herein may be practiced without many of these details. Likewise, one skilled in the relevant art will also understand that the technology can include many other features not described in detail herein. Additionally, some well-known structures or functions may not be shown or described in detail below so as to avoid unnecessarily obscuring the relevant description.

The terminology used below is to be interpreted in its broadest reasonable manner, even though it is being used in conjunction with a detailed description of some specific examples of the embodiments. Indeed, some terms may even be emphasized below; however, any terminology intended to be interpreted in any restricted manner will be overtly and specifically defined as such in this section.

FIG. 1 illustrates a conventional server rack 10 containing several servers 12 and one or more switches 18. The servers 12 are connected to the switch 18 with various cables 14. As is typical with conventional server rack configurations, the cables 14 are bundled together with multiple straps 16 (e.g., Velcro®). The sheer number of cables 14 in a single rack 10 can be difficult to manage with respect to cable replacement and/or reconnection. In some cases it is easier to cut a cable and pull it out of the straps 16 than to trace the cable and disconnect all of the straps.

Figure 2:
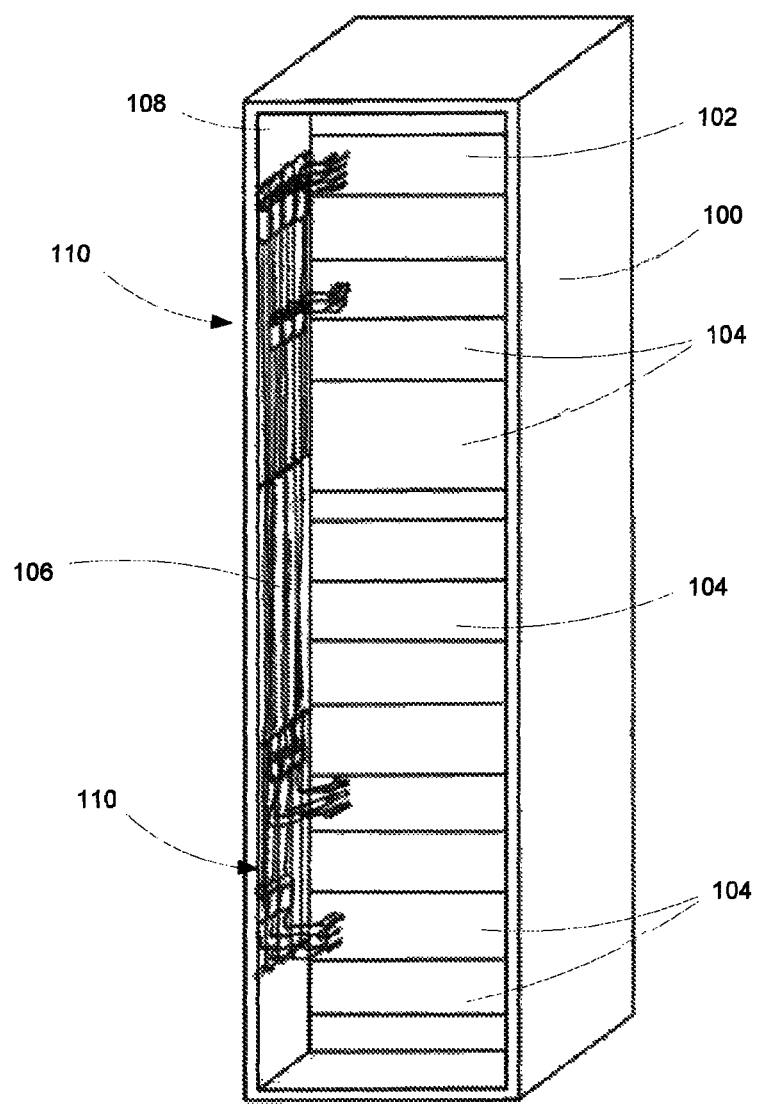
FIG. 2 is an isometric view of a server rack incorporating a cable management system according to a representative embodiment.

The disclosed cable management system provides magnetic cable retainers that can be easily removed and/or rearranged to replace or reroute a cable. FIG. 2 illustrates a server rack 100 incorporating cable management systems 110 according to a representative embodiment. The cables 106 connecting the switch 102 to servers 104 are organized on the side panel 108 of the rack 100 using one or more cable management systems 110.

Figure 3:
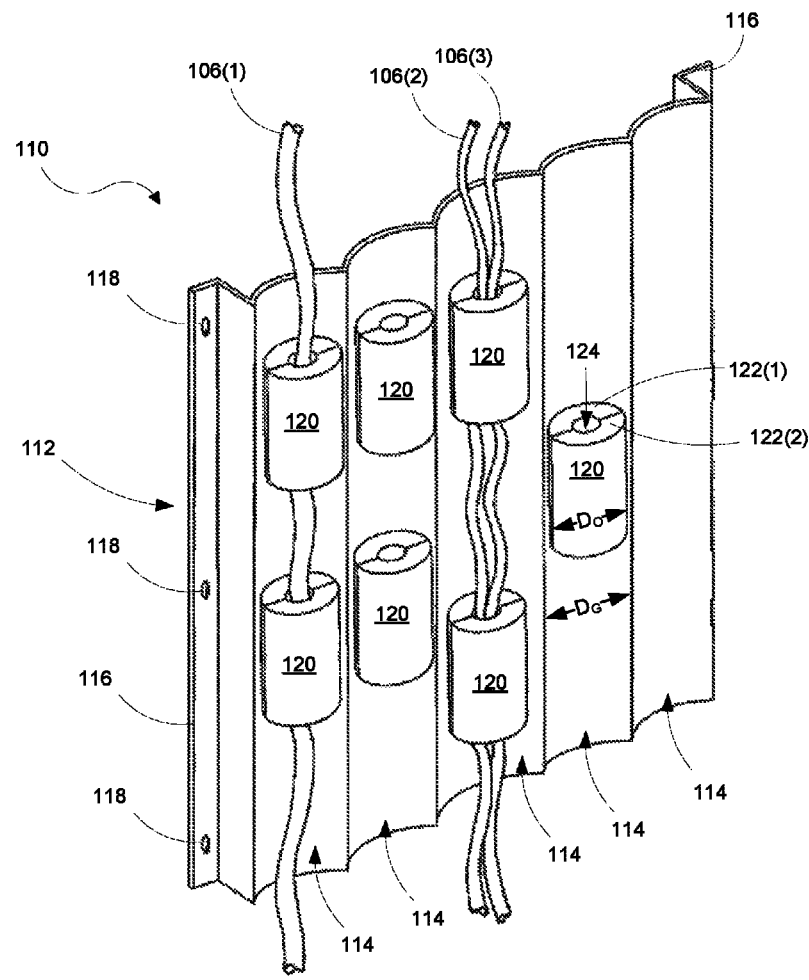
FIG. 3 is an isometric view of the cable management system shown in FIG. 2.

With further reference to FIG. 3, the cable management system 110 includes a cable management panel 112 and a plurality of magnetic cable rings 120 magnetically attached thereto. The cable management panel 112 includes a plurality of parallel concave grooves 114 extending between a pair of mounting flanges 116 configured for mounting the panel 112 to the rack 100. In some embodiments, the cable management panel is corrugated or scalloped to form the concave grooves 114. In some embodiments, the mounting flanges 116 include mounting holes 118 to facilitate fastening the panel 112 to the rack 100. In some embodiments, the cable management panel 112 comprises ferromagnetic sheet metal material.

A plurality of cable retainers, such as magnetic cable rings 120, are sized and configured for magnetic attachment to a corresponding one of the concave grooves 114. The magnetic cable rings 120 each have an outer diameter $D_O$ and each concave groove 114 has a groove diameter $D_G$ larger than the outer diameter $D_O$ of the magnetic cable rings 120. Each magnetic cable ring 120 includes a pair of ring halves 122(1)/122(2) (collectively ring halves 122) magnetically attached to each other. In one embodiment, the ring half 122(1) engaging the cable management panel 112 can be magnetically retained in a selected position against the panel. In another embodiment, the ring half 122(1) can be screwed, riveted, adhered, or otherwise mechanically fastened to the panel, and the second ring half 122(2) is magnetically connected to the first ring half 122(1). In yet another embodiment, the first ring half 122(1) can be both mechanically and magnetically affixed to the cable management panel 112. Each magnetic cable ring 120 includes a cable opening 124, whereby one or more cables 106 can be positioned between the ring halves 122 and secured to the cable management panel 112. For example, a single cable 106(1) can extend through the magnetic cable rings 120 or multiple cables, such as cables 106(2) and 106(3), can extend through the magnetic cable rings 120.

In some embodiment, at least one of the pair of ring halves 122 comprises a magnetized material, such as magnetized iron, steel, ferrite, ceramic ferrite, alnico, neodymium iron boron, or samarium cobalt, for example. In some embodiments, one of the pair of ring halves 122 comprises a non-magnetized material. For example, one of the ring half 122(1) can be a non-magnetized ferromagnetic material such as steel. In other embodiments both ring halves 122 can comprise magnetized material (e.g., magnets). In some embodiments, the magnetic cable rings 120 perform as chokes to suppress high frequency noise in the cables 106. For example, the magnetic cable rings 120 can comprise ferrite ceramic magnets, which enable the magnetic cable rings 120 to perform the function of a ferrite bead or choke.

Figure 4:
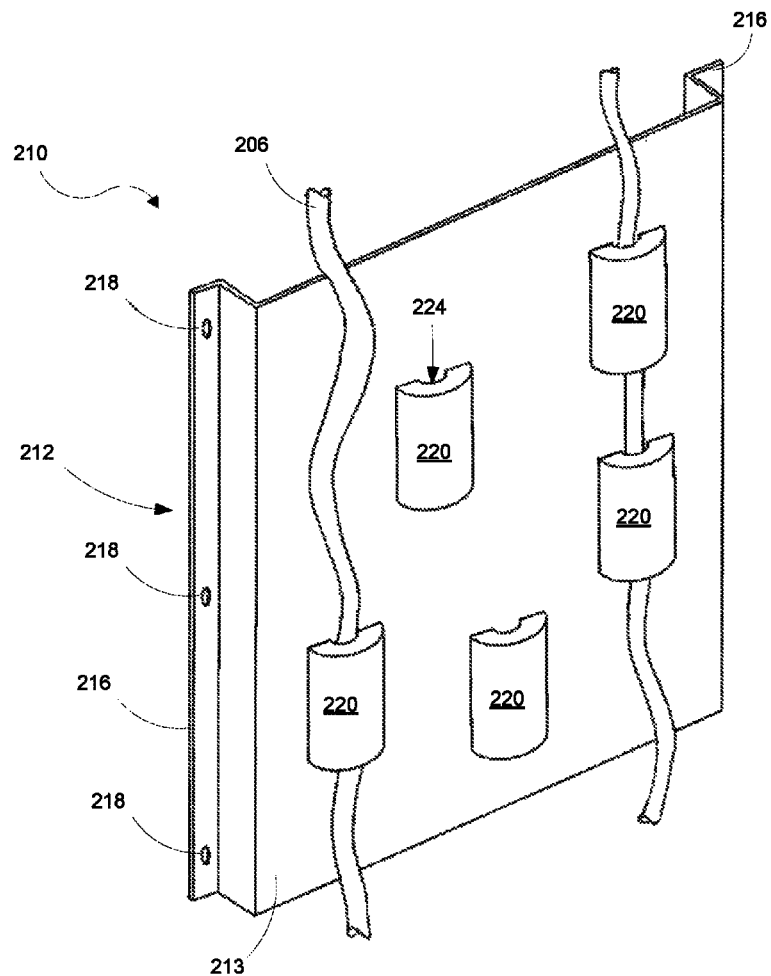
FIG. 4 is an isometric view of a cable management system according to another representative embodiment.

FIG. 4 illustrates a cable management system 210 according to another representative embodiment. The cable management system 210 includes a cable management panel 212 and a plurality of magnetic cable retainers 220 magnetically attached thereto. The cable management panel 212 includes a flat panel portion 213 extending between a pair of mounting flanges 216 configured for mounting the panel 212 to the rack 100. In some embodiments, the mounting flanges 216 include mounting holes 218 to facilitate fastening the panel 212 to the rack 100. The cable retainers 220 can be half-ring or generally C-shaped elements, for example. Each cable retainer 220 includes a cable opening 224, whereby one or more cables 206 can be positioned between the cable retainer 220 and the panel portion 213 to secure the cable 206 to the cable management panel 212. In some embodiments, the cable retainers 220 can be magnetically attached to the side panel 108 of rack 100 (FIG. 2) with one or more cables 206 positioned between the cable retainer 220 and the side panel 108.

Figure 5:
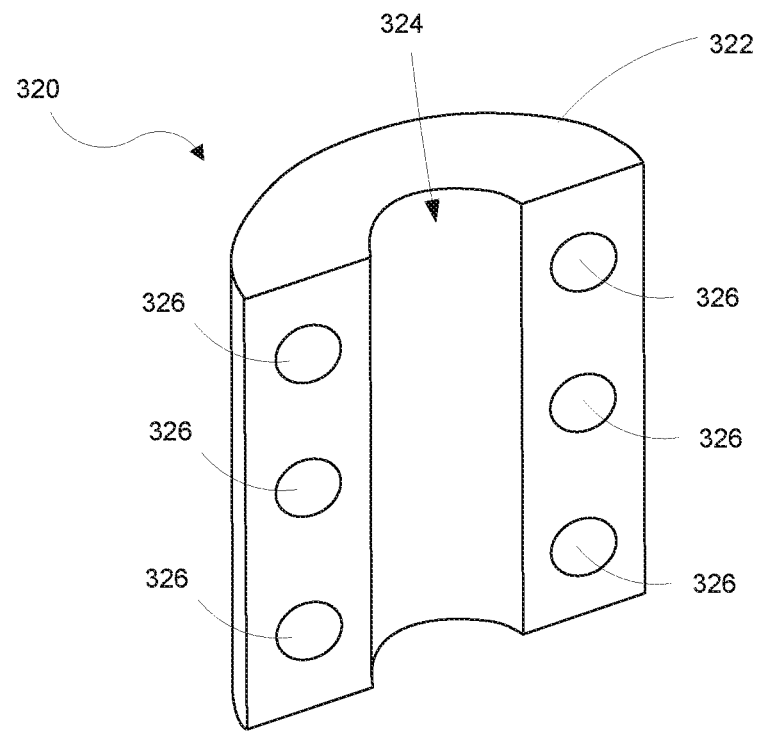
FIG. 5 is an isometric view of a cable retainer according to a representative embodiment.

In some embodiments, the cable retainer 220 and/or the ring halves 122 of the magnetic cable rings 120 (FIG. 3) can be replaced with cable retainers 320, as shown in FIG. 5. Cable retainer 320 includes a half-ring 322 with a cable opening 324 similar to the above described embodiments. In this embodiment, the half-ring 322 comprises a non-magnetized material and one or more embedded magnets 326. In some embodiments, the half-ring 322 comprises plastic. In some embodiments, the half-ring 322 comprises non-magnetized ferromagnetic material, such as steel, ferrite, or the like.

Remarks

The above description, drawings, and appendices are illustrative and are not to be construed as limiting. Numerous specific details are described to provide a thorough understanding of the disclosure. However, in some instances, well-known details are not described in order to avoid obscuring the description. Further, various modifications may be made without deviating from the scope of the embodiments.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not for other embodiments.

The terms used in this specification generally have their ordinary meanings in the art, within the context of the disclosure, and in the specific context where each term is used. It will be appreciated that the same thing can be said in more than one way. Consequently, alternative language and synonyms may be used for any one or more of the terms discussed herein, and any special significance is not to be placed upon whether or not a term is elaborated or discussed herein. Synonyms for some terms are provided. A recital of one or more synonyms does not exclude the use of other synonyms. The use of examples anywhere in this specification, including examples of any term discussed herein, is illustrative only and is not intended to further limit the scope and meaning of the disclosure or of any exemplified term. Likewise, the disclosure is not limited to various embodiments given in this specification. Unless otherwise defined, all technical and scientific terms used herein have the same meaning as commonly understood by one of ordinary skill in the art to which this disclosure pertains. In the case of conflict, the present document, including definitions, will control.

What is claimed is:

1. A cable management system for use in a rack, the system comprising:
   a cable management panel mountable to the rack, wherein the cable management panel includes a plurality of parallel concave grooves; and
   a plurality of magnetic cable rings each sized and configured for magnetic attachment to a corresponding one of the plurality of parallel concave grooves,
   wherein each magnetic cable ring includes a pair of ring halves magnetically attached to each other, whereby one or more cables can be positioned between the pair of ring halves and secured to the cable management panel.

2. The cable management system of claim 1, wherein the cable management panel is ferromagnetic.

3. The cable management system of claim 1, wherein at least one of the pair of ring halves of each magnetic cable ring comprises a non-magnetized material and one or more embedded magnets.

4. The cable management system of claim 1, wherein at least one of the pair of ring halves of each magnetic cable ring comprises a magnetized material.

5. The cable management system of claim 1, wherein one of the pair of ring halves of each magnetic cable ring comprises a magnetized material and the other ring half comprises a non-magnetized ferromagnetic material.

6. The cable management system of claim 1, wherein each magnetic cable ring is a ferrite choke for the one or more cables.

7. A cable management system for use in a server rack, the system comprising:
   a cable management panel comprising sheet metal having a plurality of parallel concave grooves and a pair of mounting flanges configured for mounting the panel to the rack; and
   a plurality of magnetic cable rings each sized and configured for magnetic attachment to a corresponding one of the plurality of parallel concave grooves,
   wherein each magnetic cable ring includes a pair of ring halves magnetically attached to each other, wherein at least one of the pair of ring halves comprises a magnetized material whereby one or more cables can be positioned between the pair of ring halves and removably secured to the cable management panel.

8. The cable management system of claim 7, wherein at least one of the ring halves of each magnetic cable ring comprises a non-magnetized material and one or more embedded magnets.

9. The cable management system of claim 7, wherein one of the pair of ring halves of each magnetic cable ring comprises a non-magnetized material.

10. The cable management system of claim 7, wherein each magnetic cable ring comprises a ferrite choke.

11. The cable management system of claim 7, wherein the plurality of magnetic cable rings each have an outer diameter and each concave groove has a groove diameter larger than the outer diameter.

12. The cable management system of claim 7, wherein the cable management panel is ferromagnetic.

* * * * *